United States Patent
Chen et al.

(10) Patent No.: US 9,968,005 B2
(45) Date of Patent: May 8, 2018

(54) DIFFERENT HDD GAP ARCHITECTURE TO REDUCE UPSTREAM PREHEAT FOR HIGH-DENSITY STORAGE

(71) Applicant: Quanta Computer Inc., Taoyuan (TW)

(72) Inventors: Chao-Jung Chen, Taoyuan (TW); Yi-Chieh Chen, Taoyuan (TW); Jen-Mao Chen, Taoyuan (TW); Wei-Chun Chang, Taoyuan (TW)

(73) Assignee: QUANTA COMPUTER, INC., Taoyuan (TW)

( * ) Notice: Subject to any disclaimer, the term of this patent is extended or adjusted under 35 U.S.C. 154(b) by 0 days. days.

(21) Appl. No.: 15/063,901

(22) Filed: Mar. 8, 2016

(65) Prior Publication Data
US 2017/0265332 A1   Sep. 14, 2017

(51) Int. Cl.
| | |
|---|---|
| H05K 7/20 | (2006.01) |
| H05K 7/14 | (2006.01) |
| G11B 33/12 | (2006.01) |
| G11B 33/14 | (2006.01) |

(52) U.S. Cl.
CPC ....... *H05K 7/20572* (2013.01); *G11B 33/128* (2013.01); *G11B 33/142* (2013.01); *H05K 7/1489* (2013.01); *H05K 7/20727* (2013.01)

(58) Field of Classification Search
CPC ........ H05K 7/1489; H05K 7/20; H05K 7/207; H05K 7/20836; H05K 7/20127–7/202
See application file for complete search history.

(56) References Cited

U.S. PATENT DOCUMENTS

| | | | |
|---|---|---|---|
| 6,563,704 B2* | 5/2003 | Grouell | H05K 7/20136 361/679.33 |
| 7,349,204 B2* | 3/2008 | Tanaka | G06F 1/181 361/679.33 |
| 7,359,186 B2* | 4/2008 | Honda | G11B 27/00 361/679.33 |

(Continued)

FOREIGN PATENT DOCUMENTS

| | | |
|---|---|---|
| JP | H08-63237 A | 3/1996 |
| JP | 2006-73045 A | 3/2006 |

OTHER PUBLICATIONS

Japan Office Action for Application No. 2017-031981, dated Mar. 6, 2018, w/ First Office Action Summary.

*Primary Examiner* — Anthony Q Edwards
(74) *Attorney, Agent, or Firm* — Nixon Peabody LLP; Eduardo J. Quinones; Zhou Lu

(57) ABSTRACT

Systems, methods and computer-readable media for reducing upstream preheat for high-density hard disk drive storage. A system can include first and second rows of storage devices installed in a storage rack, the first and second rows having a first distance between consecutive storage devices. The second row can be located behind the first row and farther away from a source of an airflow than the first row. The system can monitor a temperature associated with the second row and when the temperature rises above a threshold, the system can remove a storage device from the first row. The system can then adjust placement within the first row such that the remaining devices have a second, larger distance between each other to increase airflow to storage devices in the second row and reduce system impedance.

20 Claims, 5 Drawing Sheets

(56) References Cited

U.S. PATENT DOCUMENTS

| | | | | |
|---|---|---|---|---|
| 7,369,406 B2* | 5/2008 | Matsushima | .......... | G11B 33/12 |
| | | | | 361/679.48 |
| 7,600,557 B2* | 10/2009 | Chiang | .................. | H01L 23/40 |
| | | | | 165/80.2 |
| 7,715,188 B2* | 5/2010 | Matsushima | .......... | G11B 33/12 |
| | | | | 165/122 |
| 8,054,632 B2* | 11/2011 | Regimbal | ................ | G06F 1/181 |
| | | | | 312/223.1 |
| 8,582,299 B1* | 11/2013 | Phillips | ................ | H05K 7/1489 |
| | | | | 361/724 |
| 8,743,549 B2* | 6/2014 | Frink | ....................... | G06F 1/187 |
| | | | | 361/679.49 |
| 9,141,156 B2* | 9/2015 | Ross | ........................ | G06F 1/20 |
| 9,298,230 B2* | 3/2016 | Wei | .................... | H05K 7/20736 |
| 9,345,165 B1* | 5/2016 | Phillips | ................ | H05K 7/1489 |
| 9,474,190 B1* | 10/2016 | Beall | ....................... | G06F 1/185 |
| 2006/0048001 A1 | 3/2006 | Honda et al. | | |
| 2007/0091559 A1* | 4/2007 | Malone | .................. | G06F 1/187 |
| | | | | 361/679.32 |
| 2009/0190303 A1* | 7/2009 | Chu | ......................... | G06F 1/20 |
| | | | | 361/679.47 |
| 2009/0237877 A1 | 9/2009 | Honda et al. | | |
| 2012/0229979 A1* | 9/2012 | Morita | ............... | H05K 7/20136 |
| | | | | 361/695 |
| 2014/0233179 A1* | 8/2014 | Davis | ................ | H05K 7/20727 |
| | | | | 361/679.54 |
| 2015/0070828 A1 | 3/2015 | Mundt et al. | | |
| 2016/0070295 A1* | 3/2016 | Brause | ................ | G11B 33/128 |
| | | | | 361/679.33 |
| 2016/0165760 A1* | 6/2016 | Kutsuzawa | ........ | H05K 7/20836 |
| | | | | 361/679.5 |

\* cited by examiner

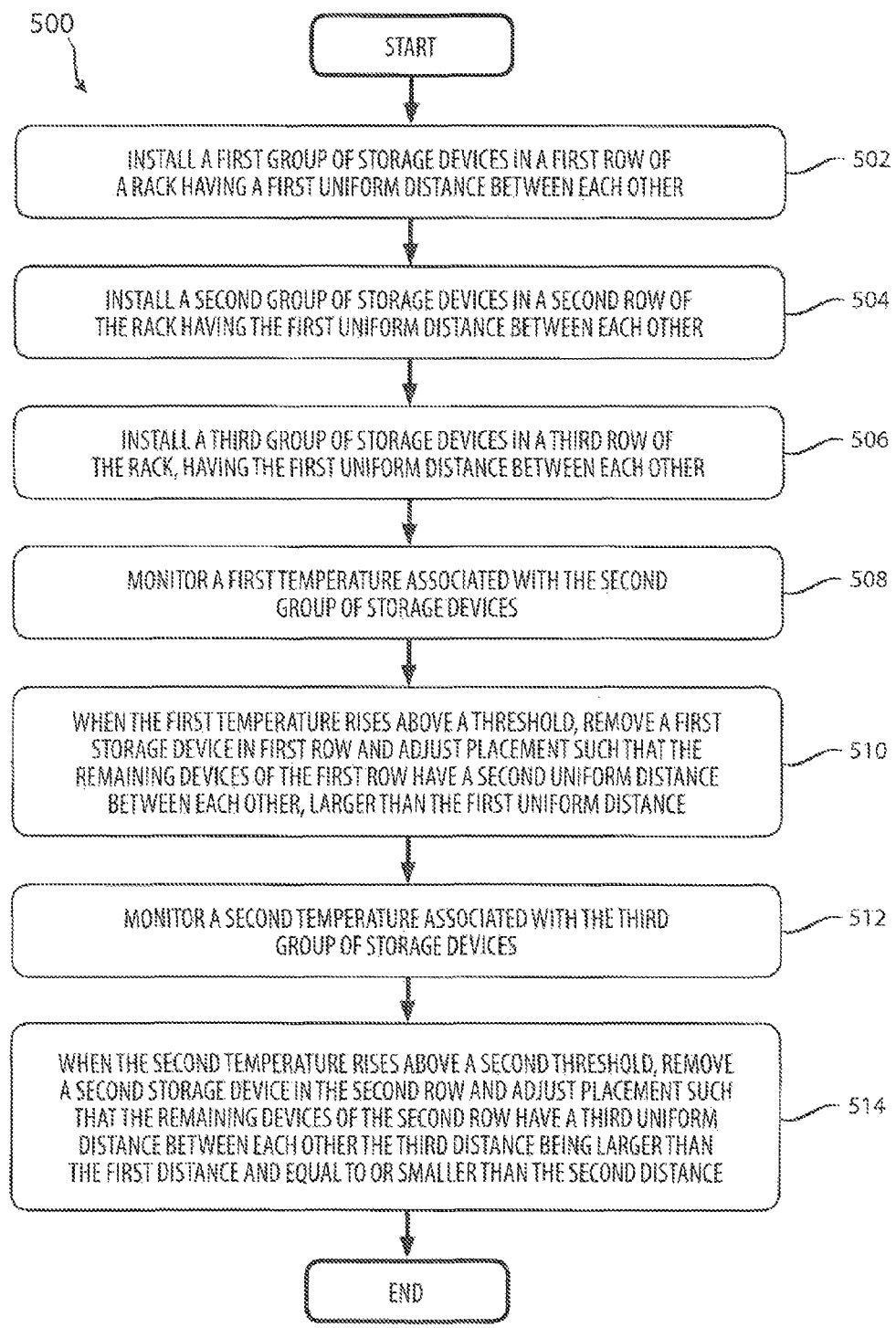

DIFFERENT HDD GAP ARCHITECTURE TO REDUCE UPSTREAM PREHEAT FOR HIGH-DENSITY STORAGE

BACKGROUND

In general system storage, storage devices such as hard disk drives are stored in storage racks and arranged such that there is the same or similar physical gap between storage devices of each row of storage devices. For high-density storage (typically five or more hard disk drive rows and fifteen or more hard disk drives per row), the quantity of storage devices can cause a high system impedance due to a small gap between the storage devices in each row. The small gap presents a challenge for cooling the storage devices because of an obstructed airflow between a cooling source such as a fan and subsequent rows of hard drives. As a result, storage devices in subsequent rows may overheat such that the system as a whole cannot reach optimal performance.

A traditional method to reduce system impedance in high-density storage is to reduce storage device quantity in the first or second rows of storage devices. However, because the existing storage devices maintain the same gap between devices in each row, this method only benefits the rear side of the removed row of storage devices and does not benefit all downstream storage device rows. Therefore, there exists a need for an improved method of reducing system impedance in high-density storage.

SUMMARY

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

Disclosed are systems, methods, and non-transitory computer-readable storage media for reducing upstream preheat for high-density storage using hard disk drive architecture. In one embodiment, the system can include a physical rack for housing storage devices, the rack having an airflow provided to the storage devices for cooling. The system can include a first row of storage devices and a second row of storage devices installed in the rack. The second row of storage devices can be located farther away from the airflow than the first row of storage devices within the rack. The first row can include a smaller number of storage devices than the second row. Any two consecutive storage devices in the first row can have a second gap distance between the any two consecutive storage devices in the first row, the second gap distance being wider than the first gap distance.

The system can include a first group of storage devices in a first row of a rack such that any two consecutive storage devices of the first group of storage devices have a first uniform distance between each other. The system can include a second group of storage devices in a second row of the rack such that any two consecutive storage devices of the second group of storage devices have the first distance between each other. The second row can be located behind the first row and can be farther away from a source of an airflow than the first row. The system can monitor a temperature associated with the second group of storage devices. When the temperature rises above a threshold, the system can remove a storage device from the first group of storage devices in the first row and adjust the placement, within the first row, of remaining storage devices of the first group of storage devices. Any two consecutive storage devices of the remaining storage devices of the first row can have a second distance between each other, the second distance being larger than the first distance.

In one embodiment, the system can include a third group of storage devices in a third row of the rack such that any two consecutive storage devices of the third group of storage devices have the first distance between each other. The third row can be located behind the second row and can be farther away from the source of the airflow than the second row. The system can monitor a first temperature associated with the second group of storage devices. When the first temperature rises above a first threshold the system can remove a first storage device from the first group of storage devices and can adjust placement, within the first row, of remaining storage devices of the first group of storage devices. Any two consecutive storage devices of the remaining storage devices of the first row can have a second distance between each other, the second distance being larger than the first distance. The system can monitor a second temperature associated with the third group of storage devices. When the second temperature rises above a second threshold, the system can remove a second storage device from the second group of storage devices in the second row. The system can adjust placement, within the second row, of remaining storage devices of the second group of storage devices. Any two consecutive storage devices of the remaining storage devices of the second row can have a third distance between each other. The third distance can be larger than the first distance and can be equal to or smaller than the second distance. Although the system can automatically adjust the placement of the storage devices, the adjustments can be made by a human operator manually as well. After the adjustments, the gap distance between the storage devices can be uniform within each row although some deviations from complete uniformity may be allowed.

BRIEF DESCRIPTION OF THE DRAWINGS

The above-recited and other advantages and features of the disclosure will become apparent by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which:

FIG. 5 illustrates another example method embodiment for reducing upstream preheat.

DETAILED DESCRIPTION

Figure 1:
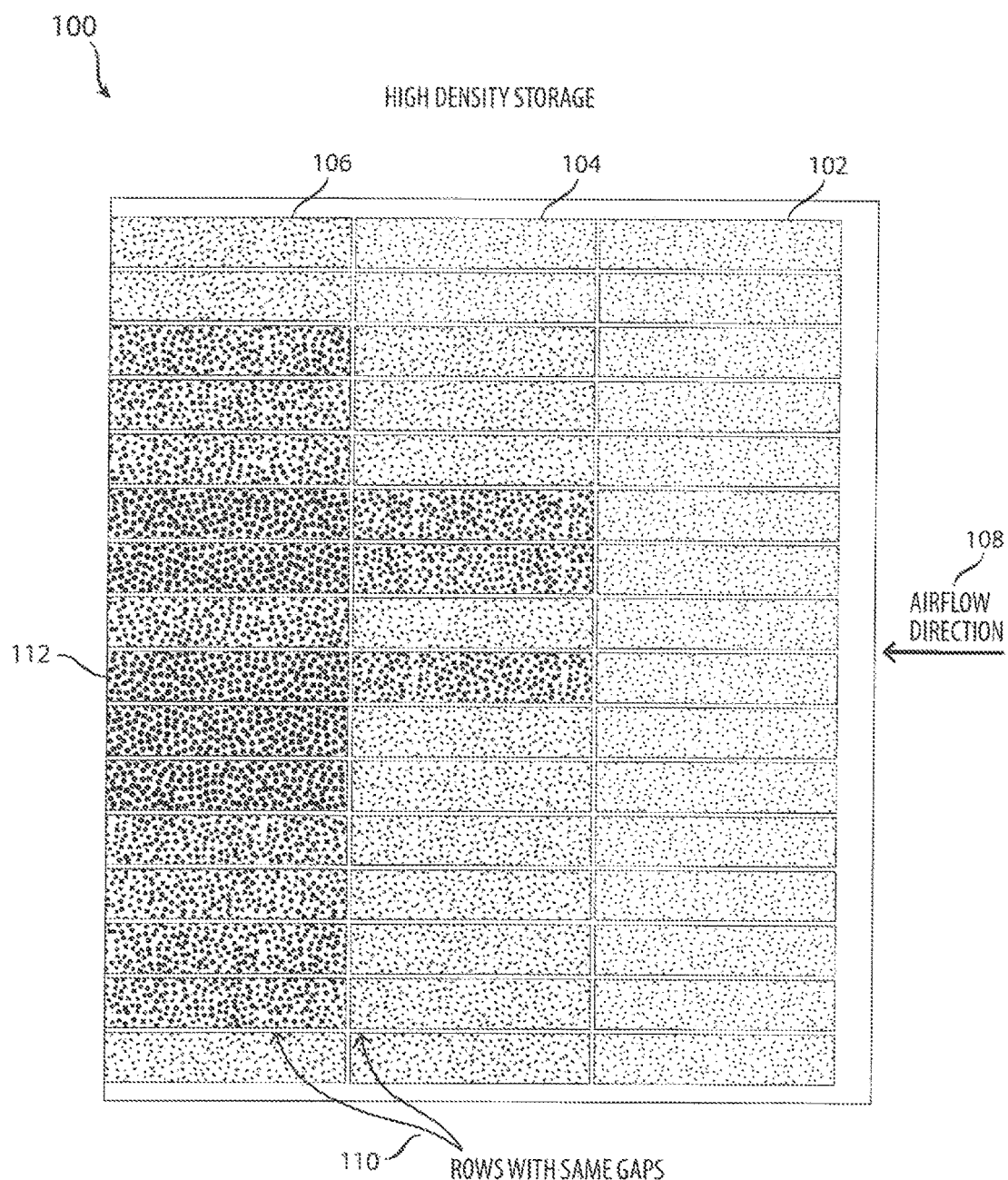
FIG. 1 illustrates an example high-density storage architecture.

The disclosed technology addresses the need in the art for reducing system impedance and improving overall system performance in high-density storage. Disclosed are systems, methods, and computer-readable storage media for reducing upstream preheat for high-density storage architecture. A brief introductory description of an exemplary system, as illustrated in FIG. 1, is disclosed herein. A detailed description of different storage architectures for reducing system impedance due to upstream preheat, and exemplary variations, will then follow. These variations shall be described herein as the various embodiments are set forth.

A disk array is a hardware element that contains a large group of storage devices such as hard disk drives. Disk arrays provide advantages in data availability, resiliency through redundant components and ease of maintenance. High-density storage refers to a storage rack housing a large number of storage devices in a relatively compact space. For example, the storage rack may have at least five rows of hard disk drives with each row containing at least fifteen hard disk drives. For such high-density storages, it is critical to manage the temperature inside every portion of the storage rack because once the temperature reaches a certain point in any portion of the rack, the individual storage devices located in the portion may start malfunctioning or perform at a suboptimal level due to the high temperature. It is therefore important to keep the overall temperature level of the high-density storage by employing a cooling mechanism. The cooling can be done by air via one or more fans that generate an airflow from the outside the storage rack and cause the airflow to be delivered into the rack. Depending on the placement of the airflow source, the individual storage elements (e.g., hard drives) may receive varying amounts of cooling airflow. For rows or columns of storage elements that are located behind another rows or columns of storage elements with respect to the source of the airflow, the airflow may have to travel through gaps between other storage elements that are in the way. However, a high system impedance can occur due to small gaps between the individual drives and the system may not be able to reach its optimal performance.

FIG. 1 illustrates an example high-density storage unit 100 having first row 102, second row 104, and third row 106, with first row 102 physically located closest to the airflow 108. One of ordinary skill in the art, however, will understand that high-density storage unit 100 can have fewer or more rows of devices than three. Each row of high-density storage unit 100 can house one or more storage elements or storage devices such as hard disk drives, solid-state drives, magnetic storage devices, optical storage devices, integrated circuit-based storage devices, etc. In this example, rows 102, 104, 106 have 16 storage devices or storage elements each mounted on them. The storage devices are mounted onto rows 102, 104, 106 with gaps 110 between them so as to allow airflow 108 to be delivered to the storage devices in rows 102, 104, 106. For example, airflow 108 can travel through the gaps between the storage devices in first row 102 to reach the storage devices in second row 104, and continue on to travel through the gaps between the storage devices in second row 104 to reach the storage devices mounted in third row 106. Since airflow 108 can only travel through the gaps between the storage devices, the storage devices themselves create an impedance for airflow 108. As the amount of overall impedance increases within high-density storage unit 100, less of airflow 208 can reach the storage devices, especially those that are situated farther away from the source of air flow 108 and as a result, the overall temperature of the devices will rise. The size of gaps 110 between the storage devices also has a direct impact on the impedance. As such, in general, larger gaps between the storage devices will decrease the impedance and thereby allow more of airflow 108 to be delivered and vice versa.

Although the example embodiments in this disclosure are described in terms of having rows of storage devices, one of skill in the art will understand that the storage devices may also be arranged in columns. In other words, even though FIG. 1 and subsequent drawings show top-down views of a high-density storage unit with individual storage elements arranged in rows, the principles described in this disclosure would equally apply if FIGS. 1-3 were to feature a side view and the storage elements are arranged in columns (e.g., first column 102, second column 104, third column 106).

In FIG. 1, second row 104 is further from a source of airflow 108 than first row 102, and third row 106 is furthest from the source of airflow 108. Gaps 110 exist between the storage devices in each of rows 102, 104, 106. Gaps 110 can be uniform throughout each row or may vary. For example, gaps nearest to the source of airflow can be greater than gaps further away from the source of airflow. The opposite can be the case as well. Varying shades of gray represent varying degrees of temperatures; a storage device having a lighter shade of gray color (i.e., fewer and smaller dots) represents a cooler storage device, and a disk drive having a darker shade of gray (i.e., more and bigger dots) represents a hotter storage device. Storage devices located near the upstream of airflow 108, such as those devices in row 102, can maintain a more desirable temperature. On the other hand, storage devices located more towards the downstream of airflow 108, such as those devices in row 106, are negatively affected by heat more. In addition, within each row, those devices that are located more towards the center of storage 100 tends to get hotter because it becomes more difficult to dissipate heat. Thus, for example, FIG. 1 shows that, within third row 106, those storage devices that are in the middle are shown with relatively denser shades of gray than the devices that are located towards the edges of high-density storage unit 100. The temperature for some of these devices may exceed the threshold temperature that represents a temperature limit for the devices' safe and/or reliable operation.

Figure 2:
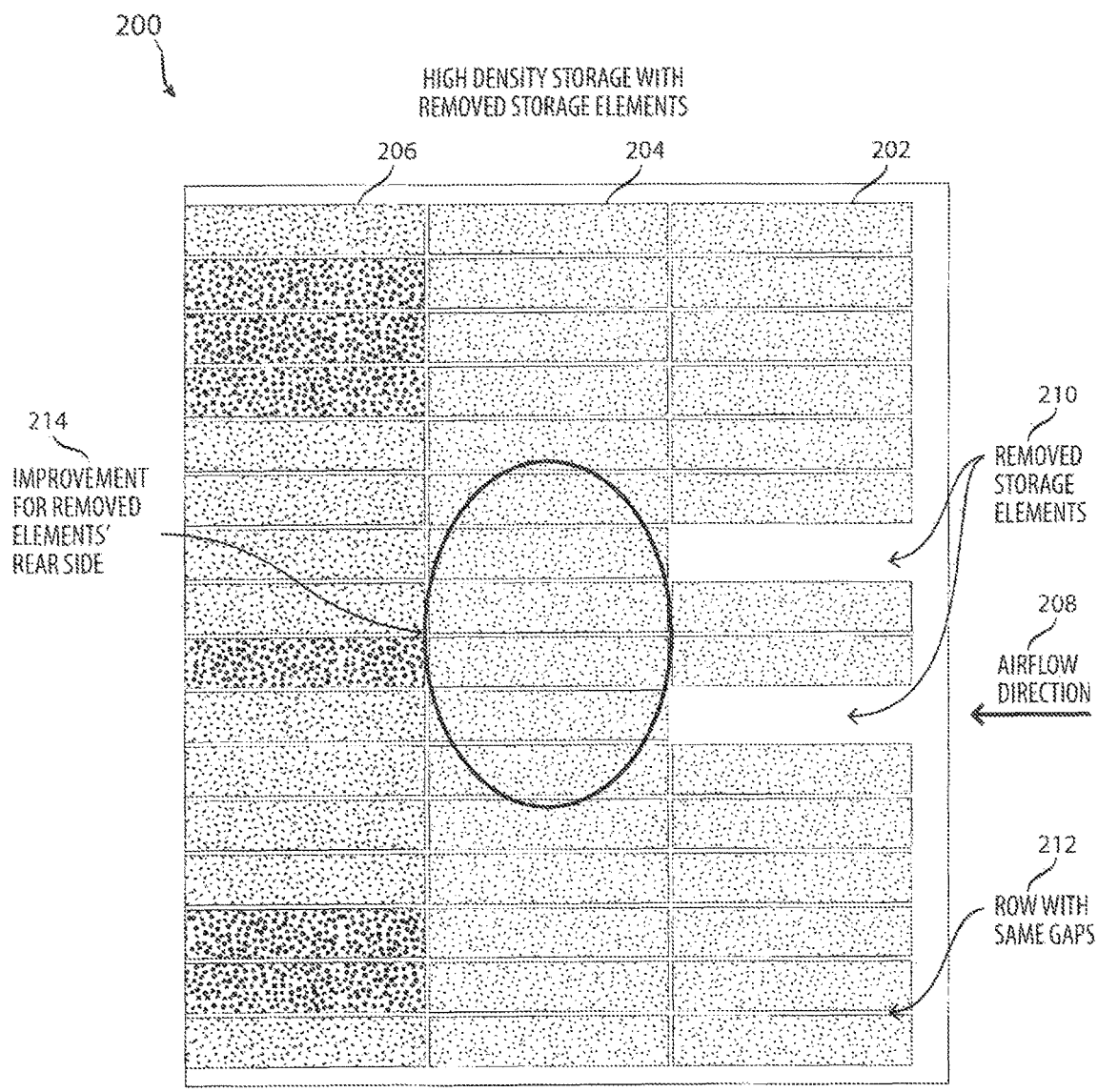
FIG. 2 illustrates an example high-density storage architecture with hard storage devices removed.

FIG. 2 illustrates an example high-density storage architecture or rack 200 with some storage devices removed. Similar to high-density storage unit 100 of FIG. 1, high-density storage architecture 200 also has first row 202, second row 204, and third row 206, each row having one or more storage devices mounted in it and third row 206 being farthest away from the source of airflow 208. Removing storage devices drives 210 close to the source of airflow 208 (e.g., from first row 202) may allow for better airflow to storage devices downstream (e.g., storage devices mounted in third row 206) and reduce system impedance. However, the overall system benefit may be small if gaps 212 between the storage elements remain the same. For example, removing two storage devices or elements 210 from first row 202 can improve the temperature level for the storage devices 214 located in second row 204 and directly behind removed devices 210 and reduce the overall system impedance. Similarly, removing devices 210 from first row 202 may also improve the heat dissipation of the storage devices in third row 206. However, the cooling effect for second row 204 and third row 206 may not be maximized due to the size of gaps 212 elsewhere in first row 202 still remaining the same.

Figure 3:
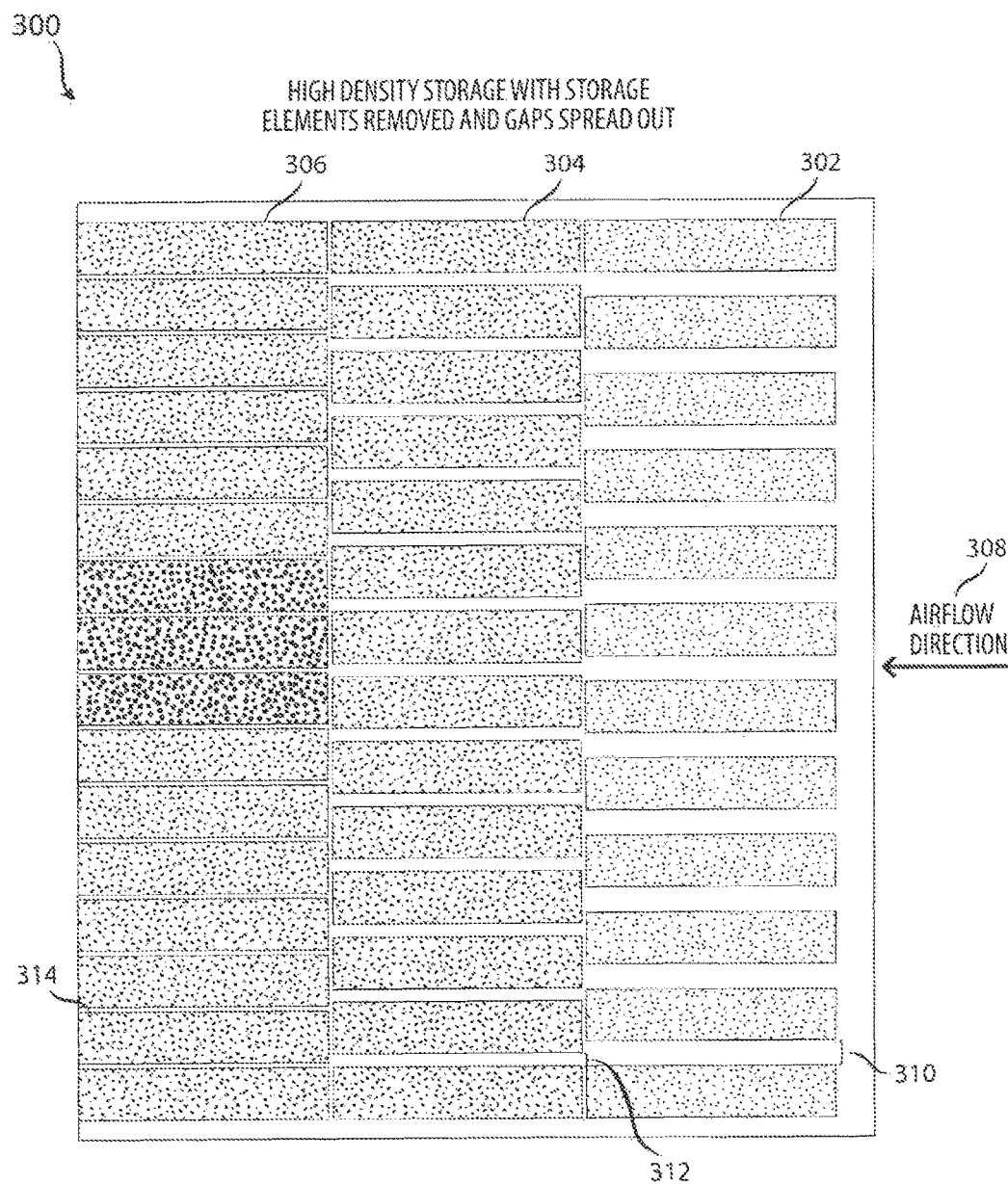
FIG. 3 illustrates an example high-density storage architecture with removed storage devices and a spread storage gap.

FIG. 3 illustrates an example high-density storage architecture with removed storage devices and a spread hard disk drive gap. Similar to high-density storage rack 200 of FIG. 2, exemplary high-density storage rack 300 of FIG. 3 also features first row 302, second row 304, and third row 306, with first row 302 being located closest to the source of airflow 308 and third row 306 being farthest away. Each row houses one or more storage devices. One or more fans (not shown) can generate airflow 308 for cooling the storage devices. First row of storage devices can be installed in rack 300. The first row can have a first group of storage devices arranged in rack 300. Any two consecutive storage devices in first row 302 can have first gap distance 310 between them in first row 302. First gap distance 310 can be uniform throughout first row 302. Alternatively, first gap distance 310 can be less than uniform throughout first row 302. In other words, one or more gaps may be still larger or smaller than the average gap size, allowing for a degree of deviation. First row 302 can include adjustable mounts for mounting the first group of storage devices, such that the adjustable mounts can be moved around to adjust first gap distance 310 between the consecutive storage devices in first row 302. First gap distance 310 can stay uniform across first row 302 as it gets adjusted.

Second row 304 of storage devices can also be installed in rack 300. Second row 304 can have a second group of storage devices arranged in rack 300. Second row 304 of storage devices can be located farther away, within rack 300, from the source of airflow 308 than first row 302 of storage devices. Second row 304 can include a larger number of storage devices than first row 302. In this example, first row 302 contains 12 storage devices while second row 304 contains 14 storage devices. Any two consecutive storage devices in second row 304 can have second gap distance 312 between them in second row 304. Second gap distance 312 can be uniform throughout second row 302 and be equal to or narrower than first gap distance 310. This is natural because first row 302 contains a fewer number of storage devices than second row 304 while the sizes of first row 302 and second row 304 remain the same. Since first gap distance 310 is wider, the flow of airflow 308 can improve in the upstream. Alternatively, second gap distance 312 can be less than uniform throughout second row 304. In other words, one or more gaps within second row 304 may be still larger or smaller than the average gap size, allowing for a degree of deviation, as long as the average gap size still remains equal to or narrower than first gap distance 310.

Second row 304 can also include adjustable mounts for mounting the second group of storage devices, such that the adjustable mounts can be moved to adjust second gap distance 312 between the consecutive storage devices in second row 304. Second gap distance 312 can stay uniform across second row 304 as gap distance 312 gets adjusted. First row 302 and second row 304 can be identical in size. In other words, even though first row 302 and second row 304 may contain different numbers of storage devices, they can still have the same width or height such that the outer edges of the outermost devices in both rows can stay flush with each other.

Third row 306 of storage devices may also be installed rack 300. Third row 306 can have a third group of storage devices arranged in rack 300. Third row 306 of storage devices can be located farther away, within rack 300, from the source of airflow 308 than second row 304 of storage devices. Third row 306 can include a still larger number of storage devices than second row 304. In this example, third row 306 contains 16 individual storage devices, which is more than what is installed in second row 304. Any two consecutive storage devices in third row 306 can have third gap distance 314 between the storage devices in third row 306. Third gap distance 314 can be equal to or narrower still than second gap distance 312. Third row 306 can include adjustable mounts for mounting the third group of storage devices, such that the adjustable mounts can be moved to adjust third gap distance 314 between any two consecutive storage devices in third row 306. Third row 306 can be identical size with first row 302 and/or second row 304 despite having a different number of storage devices mounted in it.

Some or all of the storage devices in rack 300 can form a disk array such as network attached storage (NAS) array, a storage area network (SAN) array, storage virtualization such as redundant array of independent disks (RAID), etc. Individual storage devices or elements can be one or more of hard disk drives, solid-state drives, magnetic storage devices, optical storage devices, integrated circuit-based storage devices, etc. The source of airflow 308 can be configured to direct airflow 308 through gaps between first row 302 of storage devices and then through gaps between second row 304 of storage devices when there are two rows of storage devices. The source of airflow 308 can be configured to direct airflow 308 through gaps between first row 302 of storage devices, through gaps between second row 304 of storage devices, and then through gaps between third row 306 of storage devices to reduce impedance when there are three or more rows of storage devices.

Figure 4:
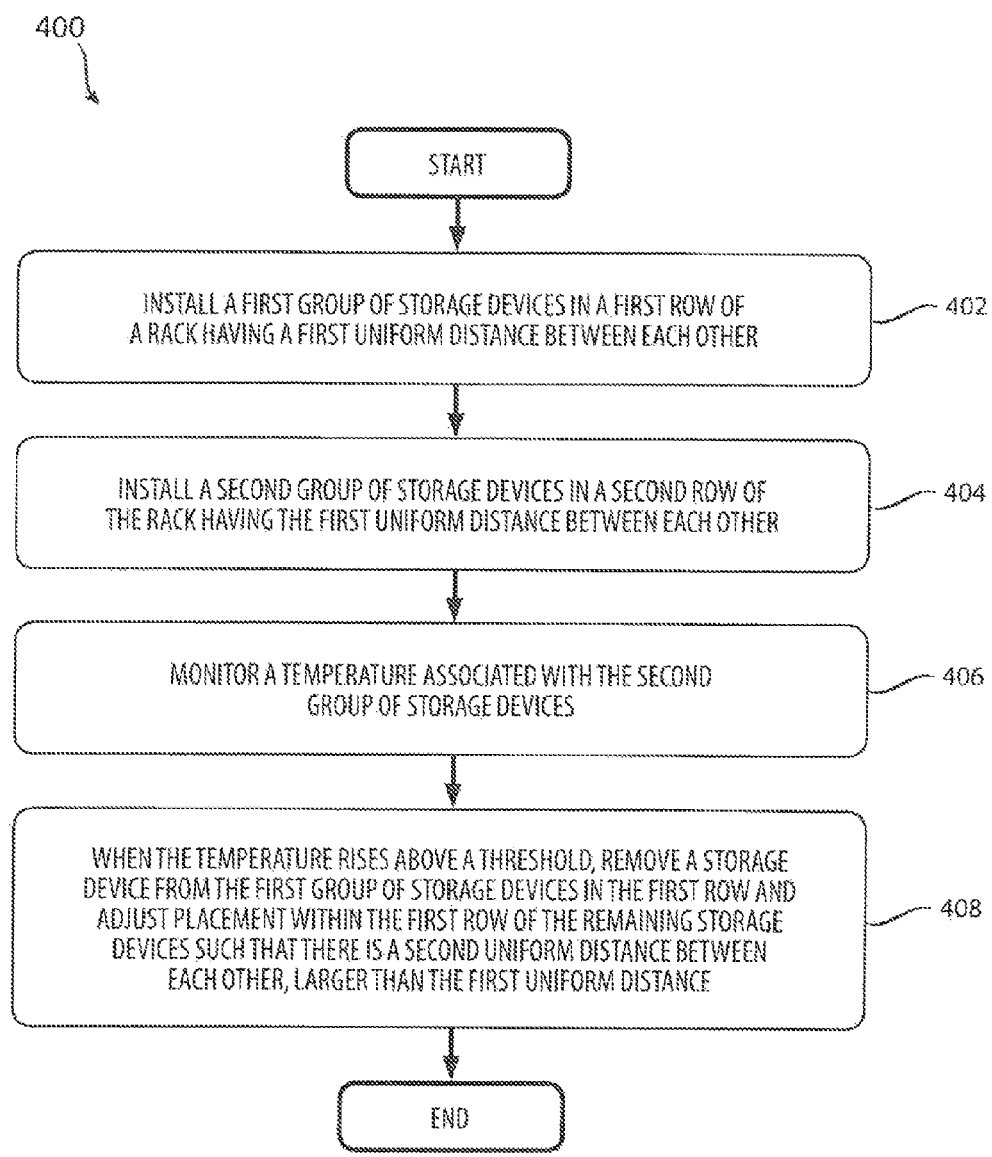
FIG. 4 illustrates an example method embodiment for reducing upstream preheat.

Having disclosed some basic system components and concepts, the disclosure now turns to the exemplary method embodiments shown in FIGS. 4 and 5. For the sake of clarity, the method is described in terms of high-density storage 300, as shown in FIG. 3, heretofore referred to as system 300 and configured to practice the method. However, the example method can be practiced by any software or hardware components, devices, etc. heretofore disclosed, such as rack system 100 of FIG. 1 or rack system 200 of FIG. 2, etc. The steps outlined herein are exemplary and can be implemented in any combination thereof in any order, including combinations that exclude, add, or modify certain steps.

FIG. 4 illustrates an example method embodiment for reducing upstream preheat. System 300 can install a first group of storage devices in a first row of a rack such that any two consecutive storage devices of the first group of storage devices have a first distance between each other (402). System 300 can install a second group of storage devices in a second row of the rack such that any two consecutive storage devices of the second group of storage devices have the first distance between each other, the second row being behind the first row and farther away from a source of an airflow than the first row (404). The system can monitor a temperature associated with the second group of storage devices (406). When the temperature rises above a threshold, the system can remove a storage device from the first group of storage devices in the first row and can adjust the placement, within the first row, of remaining storage devices of the first group of storage devices in the first row such that any two consecutive storage devices of the remaining storage devices of the first row have a second distance between each other, the second distance being larger than the first distance (408).

In one preferred embodiment, the first distance can be uniform within the first row or can vary. Similarly, the second distance can be uniform within the second row or can vary.

The removal of the storage device can be performed by the rack itself, such as by automatically adjusting the horizontal and/or vertical positions of the mounts by which the storage devices are attached to the rack. Such automatic adjustments can be accomplished by various means including the use of servo motors built into each row of the rack. The adjustments can also be made by a means external to the rack, such as a robot arm adjusting the positioning of the mounts. The automatic adjustments made, either by servo motors or by a robot, can be controlled by a computing device for precision. The computing device can detect the current positions of the mounts, calculate the desired spacing between the storage devices and new positions after the adjustments, and operate the motors or robot arms to make the necessary adjustments. Alternatively, or in combination of the automatic adjustment methods, the mounts can be manually adjusted by a human operator. By increasing the gap distance between the storage devices within the first row, the delivery of the airflow to the second row behind the first row may improve and help alleviate the heat level of the devices in the second row. The temperature can be of a preselected storage device of the second group of storage devices, the preselected storage device being installed in a middle portion of the second row. Alternatively, the temperature can be of an average temperature of the second group of storage devices. The threshold can be a temperature below which the storage devices can safely and/or reliably operate.

However, when the temperature does not fall below the threshold after the storage device is removed and the placement of the remaining storage devices is adjusted, system 300 can remove an additional storage device from the remaining storage devices in the first row to yield further remaining storage devices in the first row and can adjust placement, within the first row, of the further remaining storage devices in the first row. Any two consecutive storage devices of the further remaining storage devices of the first row can have a third distance between each other, the third distance being larger than the second distance. Thus, the airflow can be delivered to the second group of storage devices in the second row through gaps between the first group of storage devices in the first row. More of the airflow can reach the second group of storage devices in the second row through gaps between the first group of storage devices in the first row after the placement of the remaining storage devices is adjusted than before the placement of the remaining storage devices is adjusted. If necessary, more storage devices can be removed from the first row to continue to decrease the impedance and improve the airflow within system 300. Further adjustments to the placement of the any remaining storage devices can be made and the gap distance between the devices can be further increased.

The source of the airflow can be one or more fans installed in the rack. Alternatively, the airflow can be generated by a source outside the rack such as an external fan. Some or all of the storage devices in the first group of storage devices or the second group of storage devices can form a disk array such as NAS array, a SAN array, or other storage virtualization array such as RAID, etc.

FIG. 5 illustrates another example method embodiment for reducing upstream preheat. System 300 can install a first group of storage devices in a first row of a rack such that any two consecutive storage devices of the first group of storage devices can have a first distance between each other (502). The system can install a second group of storage devices in a second row of the rack such that any two consecutive storage devices of the second group of storage devices have the first distance between each other, the second row being behind the first row and farther away from a source of an airflow than the first row (504). The system can install a third group of storage devices in a third row of the rack such that any two consecutive storage devices of the third group of storage devices have the first distance between each other, the third row being behind the second row and farther away from the source of the airflow than the second row (506). Next, system 300 can monitor a first temperature associated with the second group of storage devices (508). When the first temperature rises above a first threshold, the system can remove a first storage device from the first group of storage devices in the first row and can adjust placement, within the first row, of first remaining storage devices of the first group of storage devices. Any two consecutive storage devices of the first remaining storage devices of the first row can have a second distance between each other, the second distance being larger than the first distance (510). Increasing the gap distance as such can improve the average amount of airflow that reaches the second row behind the first row. Then system 300 can monitor a second temperature associated with the third group of storage devices (512). When the second temperature rises above a second threshold, the system can remove a second storage device from the second group of storage devices in the second row. The second threshold can be equal to the first threshold. Alternatively, the second threshold can be higher or lower than the first threshold. Each of the first and second thresholds can be correlated to a temperature below which the storage devices are known to operate safely and/or reliably. System 300 can adjust the placement, within the second row, of second remaining storage devices of the second group of storage devices in the second row such that any two consecutive storage devices of the second remaining storage devices of the second row have a third distance between each other, the third distance being larger than the first distance and being equal to or smaller than the second distance (514). The first row, the second row, and the third row can be each capable of housing a same maximum number of storage devices. Even when one or more storage devices are removed from the first row or the second row, the overall sizes of the rows can remain the same because the gaps between devices are adjusted accordingly. The airflow can reach the first row, then reaches the second row through first gaps between the first group of storage devices in the first row, and then reach the third row through second gaps between the second group of storage devices in the second row.

For clarity of explanation, in some instances the present technology may be presented as including individual functional blocks including functional blocks comprising devices, device components, steps or routines in a method embodied in software, or combinations of hardware and software. Computer-readable storage devices and media expressly exclude transitory media such as energy, carrier signals, electromagnetic waves, and signals per se.

Methods according to the above-described examples can be implemented using computer-executable instructions that are stored or otherwise available from computer readable media or devices. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims. Moreover, claim language reciting "at least one of" a set indicates that one member of the set or multiple members of the set satisfy the claim.

It should be understood that features or configurations herein with reference to one embodiment or example can be implemented in, or combined with, other embodiments or examples herein. That is, terms such as "embodiment", "variation", "aspect", "example", "configuration", "implementation", "case", and any other terms which may connote an embodiment, as used herein to describe specific features or configurations, are not intended to limit any of the associated features or configurations to a specific or separate embodiment or embodiments, and should not be interpreted to suggest that such features or configurations cannot be combined with features or configurations described with reference to other embodiments, variations, aspects, examples, configurations, implementations, cases, and so forth. In other words, features described herein with reference to a specific example (e.g., embodiment, variation, aspect, configuration, implementation, case, etc.) can be combined with features described with reference to another example. Precisely, one of ordinary skill in the art will readily recognize that the various embodiments or examples described herein, and their associated features, can be combined with each other.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa. The word "exemplary" is used herein to mean "serving as an example or illustration." Any aspect or design described herein as "exemplary" is not necessarily to be construed as preferred or advantageous over other aspects or designs. Moreover, claim language reciting "at least one of" a set indicates that one member of the set or multiple members of the set satisfy the claim.

Devices implementing methods according to these disclosures can comprise hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims. Moreover, claim language reciting "at least one of" a set indicates that one member of the set or multiple members of the set satisfy the claim.

It should be understood that features or configurations herein with reference to one embodiment or example can be implemented in, or combined with, other embodiments or examples herein. That is, terms such as "embodiment", "variation", "aspect", "example", "configuration", "implementation", "case", and any other terms which may connote an embodiment, as used herein to describe specific features or configurations, are not intended to limit any of the associated features or configurations to a specific or separate embodiment or embodiments, and should not be interpreted to suggest that such features or configurations cannot be combined with features or configurations described with reference to other embodiments, variations, aspects, examples, configurations, implementations, cases, and so forth. In other words, features described herein with reference to a specific example (e.g., embodiment, variation, aspect, configuration, implementation, case, etc.) can be combined with features described with reference to another example. Precisely, one of ordinary skill in the art will readily recognize that the various embodiments or examples described herein, and their associated features, can be combined with each other.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa. The word "exemplary" is used herein to mean "serving as an example or illustration." Any aspect or design described herein as "exemplary" is not necessarily to be construed as preferred or advantageous over other aspects or designs. Moreover, claim language reciting "at least one of" a set indicates that one member of the set or multiple members of the set satisfy the claim.

What is claimed is:

1. A system comprising:
   a rack for housing storage devices, the rack having an airflow source providing an airflow to the storage devices for cooling;
   a first row of storage devices installed in the rack, the first row having a first group of storage devices arranged in the rack, wherein storage devices in the first row have a first gap distance substantially uniform between any two consecutive storage devices in the first row; and
   a second row of storage devices installed in the rack, the second row having a second group of storage devices arranged in the rack, wherein the second row of storage devices is located farther away from the airflow source than the first row of storage devices within the rack, wherein the second row comprises a larger number of storage devices than the first row, wherein storage devices in the second row have a second gap distance substantially uniform between any two consecutive storage devices in the second row, the second gap distance being narrower than the first gap distance, wherein the airflow has a direction from the first row to the second row.

2. The system of claim 1, wherein at least some of the storage devices are configured to form a disk array.

3. The system of claim 1, wherein the airflow source is one or more fans that generate the airflow from a space outside of the rack.

4. The system of claim 1, wherein the airflow source is configured to direct the airflow to flow through gaps between the first row of storage devices and then through gaps between the second row of storage devices.

5. The system of claim 1, further comprising:
   a third row of storage devices installed in the rack, the third row having a third group of storage devices arranged in the rack, wherein the third row of storage devices is located farther away from the airflow source than the second row of storage devices within the rack, wherein the third row comprises a still larger number of storage devices than the second row, wherein any two consecutive storage devices in the third row have a third gap distance between the any two consecutive storage devices in the third row, the third gap distance being narrower than the second gap distance.

6. The system of claim 1, wherein the storage devices comprise at least one of a hard disk drive, a solid-state drive, a magnetic storage device, an optical storage device, or an integrated circuit-based storage device.

7. The system of claim 1, wherein the first row and the second row are of an identical size.

8. The system of claim 1, wherein the first gap distance between the any two consecutive storage devices in the first row is adjustable.

9. A method comprising:
   installing a first group of storage devices in a first row of a rack such that any two consecutive storage devices of the first group of storage devices have a first distance substantially uniform between each other;
   installing a second group of storage devices in a second row of the rack such that any two consecutive storage devices of the second group of storage devices have the first distance between each other, the second row being behind the first row and farther away from a source of an airflow than the first row;
   monitoring a temperature associated with the second group of storage devices; and
   when the temperature rises above a threshold:
      removing a storage device from the first group of storage devices in the first row; and
      adjusting placement, within the first row, of remaining storage devices of the first group of storage devices in the first row such that any two consecutive storage devices of the remaining storage devices in the first row have a second distance substantially uniform between each other, the second distance being larger than the first distance,
   wherein the airflow has a direction from the first row to the second row.

10. The method of claim 9, further comprising:
   when the temperature does not fall below the threshold after the storage device is removed and the placement of the remaining storage devices is adjusted:
      removing an additional storage device from the remaining storage devices in the first row to yield further remaining storage devices in the first row; and
      adjusting placement, within the first row, of the further remaining storage devices in the first row such that any two consecutive storage devices of the further remaining storage devices in the first row have a third distance between each other, the third distance being larger than the second distance.

11. The method of claim 9, wherein more of the airflow reaches the second group of storage devices in the second row through gaps between the first group of storage devices in the first row after the placement of the remaining storage devices is adjusted than before the placement of the remaining storage devices is adjusted.

12. The method of claim 9, wherein at least one of the first group of storage devices or the second group of storage devices forms a disk array.

13. The method of claim 9, wherein the airflow is delivered to the second group of storage devices in the second row through gaps between the first group of storage devices in the first row.

14. The method of claim 9, wherein the source of the airflow is one or more fans installed in the rack.

15. The method of claim 9, wherein the temperature is of a preselected storage device of the second group of storage devices, the preselected storage device being installed in a middle portion of the second row.

16. The method of claim 9, wherein the first group of storage devices and the second group of storage devices comprise at least one of a hard disk drive, a solid-state drive, a magnetic storage device, an optical storage device, or an integrated circuit-based storage device.

17. The method of claim 9, wherein the first row and the second row are of an equal size.

18. A method comprising:
   installing a first group of storage devices in a first row of a rack such that any two consecutive storage devices of the first group of storage devices have a first distance substantially uniform between each other;
   installing a second group of storage devices in a second row of the rack such that any two consecutive storage devices of the second group of storage devices have the first distance between each other, the second row being behind the first row and farther away from a source of an airflow than the first row;

installing a third group of storage devices in a third row of the rack such that any two consecutive storage devices of the third group of storage devices have the first distance between each other, the third row being behind the second row and farther away from the source of the airflow than the second row;

monitoring a first temperature associated with the second group of storage devices;

when the first temperature rises above a first threshold:
removing a first storage device from the first group of storage devices in the first row; and
adjusting placement, within the first row, of first remaining storage devices of the first group of storage devices in the first row such that any two consecutive storage devices of the first remaining storage devices of the first row have a second distance substantially uniform between each other, the second distance being larger than the first distance;

monitoring a second temperature associated with the third group of storage devices; and when the second temperature rises above a second threshold:
removing a second storage device from the second group of storage devices in the second row; and
adjusting placement, within the second row, of second remaining storage devices of the second group of storage devices in the second row such that any two consecutive storage devices of the second remaining storage devices of the second row have a third distance substantially uniform between each other, the third distance being larger than the first distance and being equal to or smaller than the second distance, wherein the airflow has a direction from the first row to the second row.

19. The method of claim 18, wherein the first row, the second row, and the third row are each capable of housing a same maximum number of storage devices.

20. The method of claim 19, wherein the airflow reaches the first row, then reaches the second row through first gaps between the first group of storage devices in the first row, and then reaches the third row through second gaps between the second group of storage devices in the second row.

* * * * *